United States Patent [19]

Cabaniss

[11] Patent Number: 5,513,152
[45] Date of Patent: Apr. 30, 1996

[54] CIRCUIT AND METHOD FOR DETERMINING THE OPERATING PERFORMANCE OF AN INTEGRATED CIRCUIT

[75] Inventor: Frank W. Cabaniss, Columbia, S.C.

[73] Assignee: AT&T Global Information Solutions Company, Dayton, Ohio

[21] Appl. No.: 263,628

[22] Filed: Jun. 22, 1994

[51] Int. Cl.[6] .............................. G04F 8/00; H01L 21/66; G06F 1/00
[52] U.S. Cl. ........................ 368/118; 324/617; 395/550
[58] Field of Search ......................... 368/113, 117–120; 324/617; 327/250, 252; 364/569; 395/425, 550

[56] References Cited

U.S. PATENT DOCUMENTS

| | | | |
|---|---|---|---|
| 4,095,267 | 6/1978 | Morimoto | 364/200 |
| 4,524,417 | 6/1985 | Kimoto | 364/200 |
| 4,685,614 | 8/1987 | Levine | 236/78 D |
| 4,688,947 | 8/1987 | Blaes et al. | 368/120 |
| 4,725,944 | 2/1988 | Koenig | 364/200 |
| 4,797,864 | 1/1989 | Stano et al. | 368/111 |
| 4,819,164 | 4/1989 | Branson | 364/200 |
| 4,866,685 | 9/1989 | Lee | 368/117 |
| 4,893,271 | 1/1990 | Davis et al. | 364/900 |
| 4,958,309 | 9/1990 | Turkal | 364/580 |
| 5,167,031 | 11/1992 | Watanabe | 395/550 |
| 5,247,636 | 9/1993 | Minnick et al. | 395/425 |
| 5,459,402 | 10/1995 | Ueno et al. | 324/617 |

*Primary Examiner*—Vit W. Miska
*Attorney, Agent, or Firm*—Paul W. Martin

[57] ABSTRACT

A circuit and method for determining the operating performance of an integrated circuit which may be used to screen integrated circuits prior to sale or delivery, or to optimize the frequency of the integrated circuit during use. The circuit employs a comparison circuit to compare a first time of arrival of a clock pulse, which is propagating through the integrated circuit with a second time of arrival of the clock signal at a second input. The comparison circuit produces an output signal which may be used to reject or accept the integrated circuit, or to automatically adjust the frequency to minimize the delay.

20 Claims, 2 Drawing Sheets

CIRCUIT AND METHOD FOR DETERMINING THE OPERATING PERFORMANCE OF AN INTEGRATED CIRCUIT

BACKGROUND OF THE INVENTION

The present invention relates to integrated circuits, and more specifically to a circuit and method for determining the operating performance of an integrated circuit.

Clocked integrated circuits, in particular, microprocessors, have maximum frequencies which are dependent on many factors. Such factors include processing load, transistor junction temperature, and applied bias voltages. Normally, all of these factors are considered when developing a specification based upon a predetermined maximum frequency. The predetermined maximum frequency is typically chosen as a "worst" case, i.e., when all of the factors are present.

In some specifications, special sorting and tighter temperature and voltage ranges are prescribed to squeeze a higher level of performance out of an integrated circuit meeting the specification. However, integrated circuits produced by such approaches are prone to failure, since the ranges are easily exceeded.

Therefore, it would be desirable to provide a circuit and method for determining the operating performance of integrated circuits and for indicating such performance degradation. It would also be desirable to provide a circuit and method which automatically vary the operating frequency of an integrated circuit to an optimal level. Such a circuit would reduce the operating frequency before limits are exceeded.

SUMMARY OF THE INVENTION

In accordance with the teachings of the present invention, a circuit and method for determining the operating performance of an integrated circuit are provided. The circuit employs a comparison circuit to compare a first time of arrival of a clock pulse, which is propagating through the integrated circuit with a second time of arrival of the clock signal at a second input. In a first embodiment, the comparison circuit produces an output signal which automatically adjusts the frequency to minimize the delay. In a second embodiment, the comparison circuit produces an output signal which is used to reject or accept the integrated circuit prior to sale or delivery.

Under the method for determining the operating performance of an integrated circuit of the present invention, a clock signal from a clock circuit is coupled to a signal path through the integrated circuit and to a first input of a comparison circuit. The clock signal is coupled to a second input of the comparison circuit. Finally, the arrival times of a clock pulse at the first and second inputs of the comparison circuit are compared by the comparison circuit. The comparison circuit generates an output signal which may be used to accept or reject the integrated circuit or to automatically adjust the clock frequency to minimize the delay.

It is accordingly an object of the present invention to provide a circuit and method which determine the operating performance of an integrated circuit under various conditions.

It is another object of the present invention to automatically lower the operating frequency of an integrated circuit when adverse factors, such as an increase in the operating temperature of the integrated circuit, are present.

It is another object of the present invention to provide a circuit and method which warn an operator when the frequency of the integrated circuit is too low or too high.

It is another object of the present invention to provide a circuit and method which may be used to test integrated circuits having single clock frequencies to either accept or reject the integrated circuits prior to sale or delivery.

BRIEF DESCRIPTION OF THE DRAWINGS

Additional benefits and advantages of the present invention will become apparent to those skilled in the art to which this invention relates from the subsequent description of the preferred embodiments and the appended claims, taken in conjunction with the accompanying drawings in which:

DETAILED DESCRIPTION OF THE PREFERRED EMBODIMENT

Figure 1:
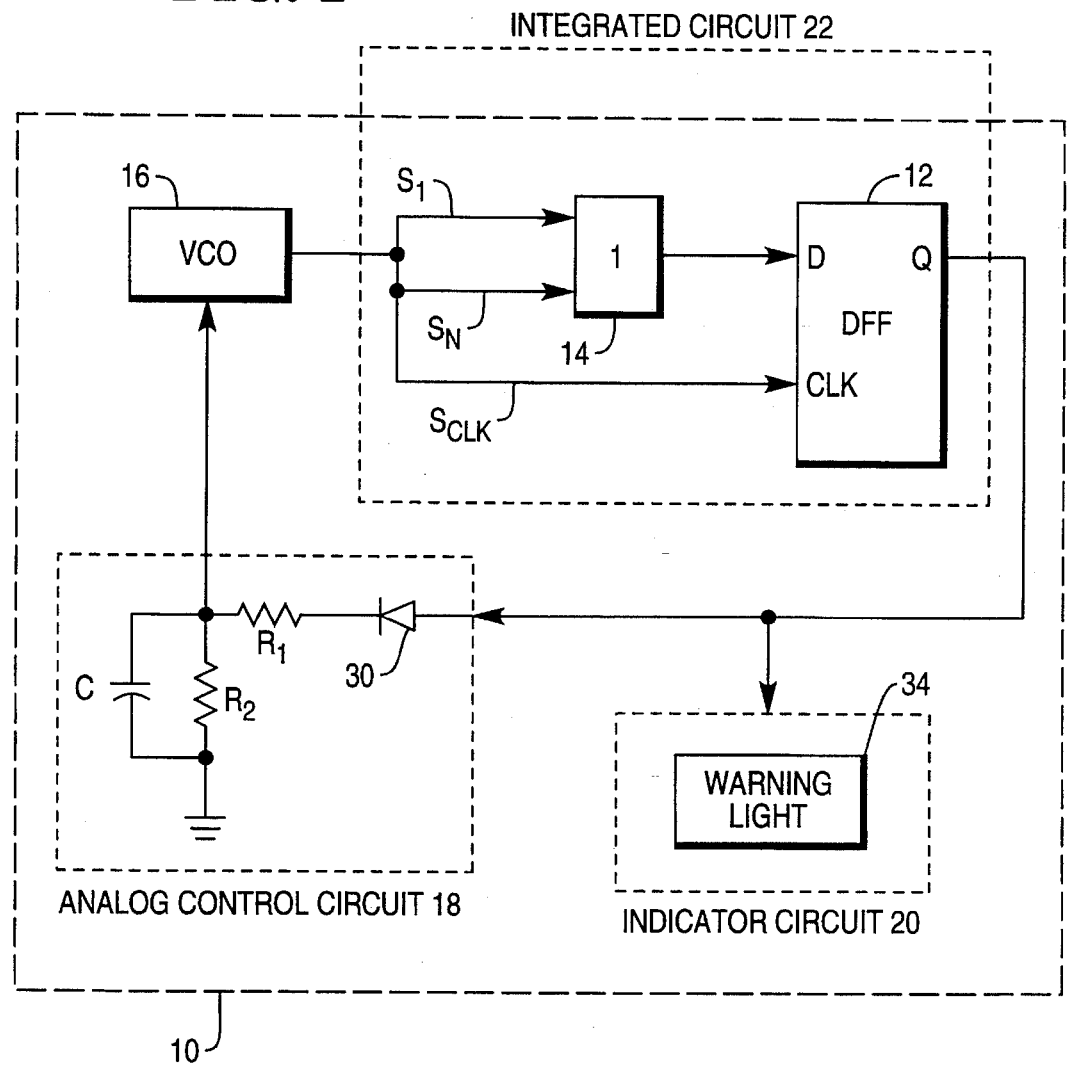
FIG. 1 is a diagram of a first embodiment of the circuit of the present invention.

Referring now to FIG. 1, a first embodiment 10 of the circuit of the present invention is shown in combination with an integrated circuit 22. Circuit 10 of the present invention includes D-type flip-flop 12, OR gate 14, signal paths $S_1$ through $S_N$, reference clock path $S_{CLK}$, voltage-controlled oscillator (VCO) 16, analog control circuit 18, and indicator circuit 20.

D-type flip-flop 12 is preferably fabricated as part of integrated circuit 22, which is optimized and protected by circuit 10.

Reference clock path $S_{CLK}$ may be located on or off integrated circuit 22.

Signal path $S_1$ represents a worst case speed path through a predetermined set of components on integrated circuit 22. Signal path $S_1$ is normalized to a half clock period for purposes of illustration. Note that any multiple of the half clock period may be used in accordance with known design techniques.

When a plurality of signal paths $S_N$ are employed, OR gate 14 may be used to filter out all but the largest delay. Signal paths $S_N$ represent multiples of a half clock period. Multiple signal paths $S_N$ within integrated circuit 22 are preferred in order to determine the largest delay within integrated circuit 22.

Each signal path $S_N$ is coupled at its other end to VCO 16, which provides the clock signal that is coupled to signal paths $S_N$ and clock path $S_{CLK}$.

VCO 16 may be located on or off integrated circuit 22. VCO 16 produces an output clock signal CLK.

Analog control circuit 18 produces a current voltage which controls the output frequency of VCO 16. The output voltage of analog control circuit 18 is controlled by output Q of D-type flip-flop 12. Analog control circuit 18 may be located off integrated circuit 22 and may include diode 30, charging resistor $R_1$, discharging resistor $R_2$, and capacitor C. The time constants of resistor-capacitor combinations $R_1C$ and $R_2C$ is greater than one clock cycle.

The RC time constants are chosen to limit the rate of change. This provides frequency stability. Some microprocessors have specifications on rate of frequency change. The RC time constants must be fast enough to allow VCO 16 to react faster than the conditions which effect the maximum frequency. Resistor-capacitor combination $R_2/C$ also insures that VCO 16 starts at a minimum frequency and then works up to higher frequencies as necessary. This could prevent problems caused by a clock which is too fast.

Indicator circuit 20 couples to output Q of D-type flip-flop 12 and provides an indication of delay. Indicator circuit 20 preferably includes a warning light 34.

Figure 2A:
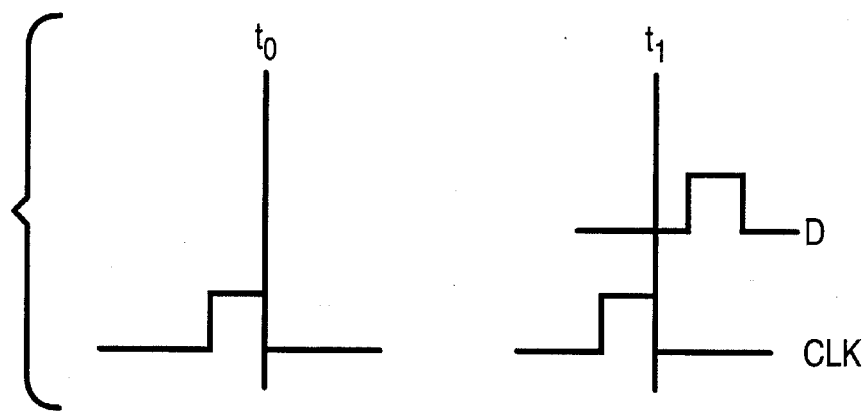
FIG. 2A is a first timing diagram illustrating the operation of the circuit of the present invention.
Figure 2B:
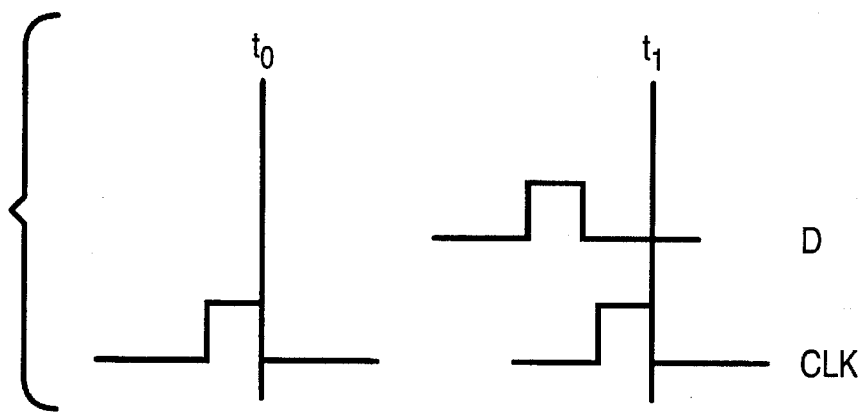
FIG. 2B is a second timing diagram illustrating the operation of the circuit of the present invention.
Figure 2C:
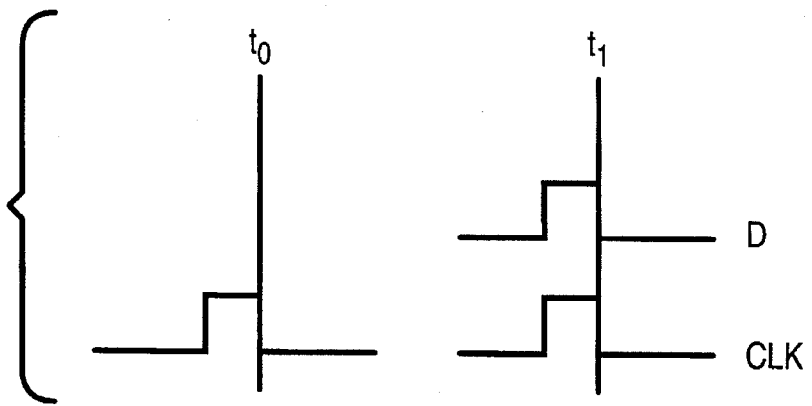
FIG. 2C is a third timing diagram illustrating the operation of the circuit of the present invention.

Turning now to FIGS. 2A–2C, operation of the circuit of the present invention is explained in detail. In each figure, time $t_0$ is the reference start time of clock pulse CLK. Time t1 is the arrival time of the leading edge of clock pulse CLK. The clock pulse which propagates through integrated circuit 22 and arrives at the D input of D-type flip-flop 12 is also represented in relation to time t1.

FIG. 2A illustrates operation when the clock signal propagates through the worst case path $S_1$ after the next clock edge reaches D-type flip-flop 12. D-type flip-flop 12 generates a signal having a positive polarity, which is fed back to analog control circuit 18 where it charges capacitor $C_1$ with a positive direct voltage through resistor $R_1$. Thus, analog control circuit 18 causes VCO 16 to output a higher frequency clock signal until the clock signal propagating through signal path $S_1$ arrives at the same time that the next clock edge reaches D-type flip-flop 12 (FIG. 2C).

FIG. 2B illustrates operation when the clock signal propagates through the worst case path $S_1$ before the next clock edge reaches D-type flip-flop 12. D-type flip-flop 12 generates a signal having a negative polarity, which is fed back to analog control circuit 18 where it charges capacitor $C_1$ with a negative direct voltage through resistor $R_1$. Thus, analog control circuit 18 causes VCO 16 to output a lower frequency clock signal until the clock signal propagating through signal path $S_1$ arrives at the same time that the next clock edge reaches D-type flip-flop 12 (FIG. 2C).

FIG. 2C illustrates operation when the clock signal propagates through the worst case path $S_1$ at the same time that the next clock edge reaches D-type flip-flop 12.

Since the propagation delay through worst case path $S_1$ varies with all the factors that effect the frequency of integrated circuit 22, the output of D-type flip-flop 12 is an accurate indication of whether integrated circuit 22 is operating at its maximum frequency under current conditions.

Indicator circuit 20 responds to the negative polarity signal by operating indicator light 34 to warn a user that integrated circuit 22 is being adversely affected by heat and other factors that decrease performance.

Figure 3:
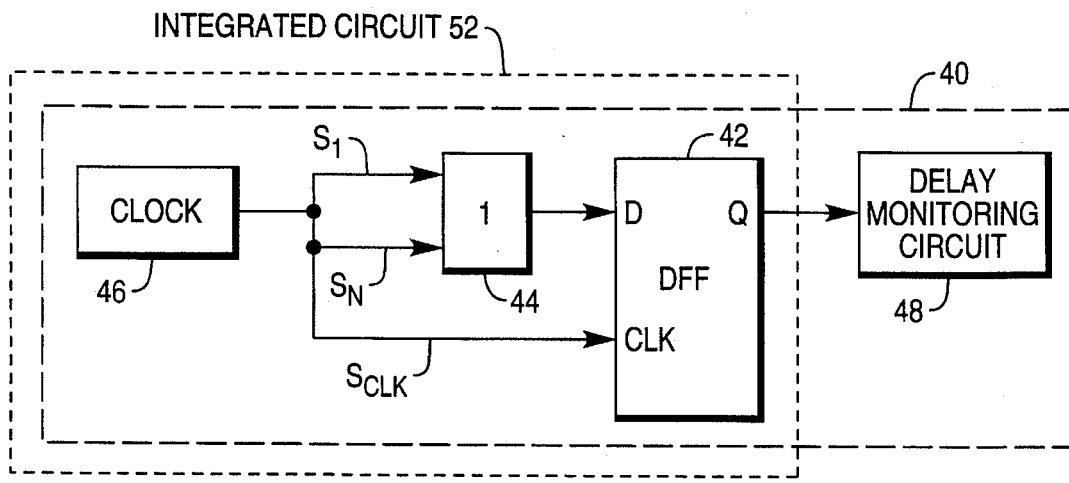
FIG. 3 is a diagram of a second embodiment of the circuit of the present invention.

Turning now to FIG. 3, circuit 10 may be adapted for testing and screening integrated circuits, having fixed frequency clocks, for sale or delivery. The integrated circuits are rejected if the delay is greater than a predetermined threshold and accepted if the delay is below the threshold.

Thus, a second embodiment 40 of the present invention includes clock 46, signal paths $S_1$ through $S_N$, OR gate 44, D-type flip-flop 42, and delay monitoring circuit 48. Signal path $S_1$ through $S_N$, reference clock path $S_{CLK}$, OR gate 44, and D-type flip-flop 42 perform the same functions in the second embodiment 40 as in the first embodiment 10.

Clock 46 generates a single frequency clock signal.

Delay monitoring circuit 48 notes the delay, if any, of the clock signal CLK in propagating through signal paths $S_1$ through $S_N$.

In operation, integrated circuit 52 is operated under a variety of test conditions, which include variations in temperature, bias voltage, and operating load. Many such integrated circuits can be tested in this way and rejected if the delay exceeds the threshold. The threshold may be set so that a "high" output from D-type flip-flop 42 indicates failure, while a "low" output from D-type flip-flop indicates passage.

Although the present invention has been described with particular reference to certain preferred embodiments thereof, variations and modifications of the present invention can be effected within the spirit and scope of the following claims.

What is claimed is:

1. A circuit for determining the operating performance of an integrated circuit comprising:

a clock circuit which produces a clock signal;

a first signal path through the integrated circuit and coupled at a first end to the clock circuit;

a second signal path through the integrated circuit and coupled at a first end to the clock circuit; and a comparison circuit having first and second inputs coupled at second ends of the first and second signal paths for determining a time delay between the clock signal along the first signal path and the clock signal along the second signal path.

2. The circuit as recited in claim 1, wherein the first signal path provides the most delay.

3. The circuit as recited in claim 1, wherein the second signal path provides the most delay.

4. The circuit as recited in claim 1, wherein the clock circuit operates at a single frequency.

5. The circuit as recited in claim 1, wherein the clock circuit is tunable to a plurality of frequencies.

6. The circuit as recited in claim 1, wherein the clock circuit comprises a voltage-controlled oscillator.

7. The circuit as recited in claim 1, wherein the comparison circuit comprises a D-type flip-flop.

8. The circuit as recited in claim 6, further comprising:

a feedback circuit between the comparison circuit and the voltage-controlled oscillator for minimizing the delay between the first and second signal paths;

wherein the output signal of the comparison circuit has a first polarity when the clock signal at the first input of the comparison circuit arrives before the clock signal arrives at the second input of the comparison circuit, and has a polarity opposite to the first polarity when the clock signal at the first input of the comparison circuit arrives after the clock signal arrives at the second input of the comparison circuit.

9. The circuit as recited in claim 8, further comprising:

an indicator circuit coupled to the output of the comparison circuit.

10. The apparatus as recited in claim 9, wherein the indicator circuit comprises:

a warning light.

11. The apparatus as recited in claim 8, wherein the feedback circuit comprises:

an analog control circuit which stabilizes the frequency of the clock signal from the voltage-controlled oscillator.

12. The circuit as recited in claim 11, wherein the analog control circuit comprises:

a first resistor coupled to the output of the comparison circuit;

a capacitor coupled to the first resistor and to a ground; and a second resistor coupled in parallel with the capacitor.

13. The apparatus as recited in claim 1, further comprising:

a third signal path through the integrated circuit and coupled at a first end to the clock circuit;

an OR gate having first and second inputs and an output;

wherein the output of the OR gate is coupled to the first input of the comparison circuit;

wherein the second end of the second signal path is coupled to the first input of the OR gate; and wherein a second end of the third signal path is coupled to the second input of the OR gate.

14. A circuit for determining the operating performance of an integrated circuit comprising:

a single frequency clock circuit which produces a clock signal;

a first signal path through the integrated circuit and coupled at a first end to the clock circuit;

a second signal path through the integrated circuit and coupled at a first end to the clock circuit;

a D-type flip-flop, having first and second inputs coupled at second ends of the first and second signal paths and an output, for determining a time delay between the clock signal along the first signal path and the clock signal along the second signal path; and a delay monitoring circuit coupled to the output of the D-type flip-flop.

15. A circuit for optimizing the operating performance of an integrated circuit comprising:

a voltage-controlled oscillator which produces a clock signal;

a first signal path through the integrated circuit and coupled at a first end to the voltage-controlled oscillator;

a second signal path through the integrated circuit and coupled at a first end to the voltage-controlled oscillator;

a D-type flip-flop, having first and second inputs coupled at second ends of the first and second signal paths and an output, for determining a time delay between the clock signal along the first signal path and the clock signal along the second signal path; and a feedback circuit between the D-type flip-flip and the voltage-controlled oscillator for minimizing the delay between the first and second signal paths;

wherein the output signal of the D-type flip-flip has a first polarity when the clock signal at the first input of the D-type flip-flip arrives before the clock signal arrives at the second input of the D-type flip-flip, and has a polarity opposite to the first polarity when the clock signal at the first input of the D-type flip-flip arrives after the clock signal arrives at the second input of the D-type flip-flip.

16. The apparatus as recited in claim 15, wherein the feedback circuit comprises:

an analog control circuit which stabilizes the frequency of the clock signal from the voltage-controlled oscillator.

17. A method for determining the operating performance of an integrated circuit comprising the steps of:

(a) coupling a clock signal from a clock circuit to a signal path through the integrated circuit, wherein the signal path terminates at a first input of a comparison circuit;

(b) coupling the clock signal to a second input of the comparison circuit; and (c) comparing a first time of arrival of a clock pulse at the first input with a second time of arrival at the second input by the comparison circuit.

18. The method as recited in claim 17, further comprising the step of:

(d) generating an output signal by the comparison signal containing the result of step (c).

19. The method as recited in claim 18, further comprising the steps of:

(e) rejecting the integrated circuit if the delay is greater than a predetermined threshold; and (f) accepting the integrated circuit if the delay is below the threshold.

20. The method as recited in claim 17, further comprising the steps of:

(d) feeding back a signal from the comparison device to the clock circuit to decrease the clock signal frequency if the first time of arrival is after the second time of arrival by the clock frequency control circuit and increase the clock signal frequency if the first time of arrival is before the second time of arrival.

* * * * *